(12) United States Patent
Hong

(10) Patent No.: US 10,741,139 B2
(45) Date of Patent: Aug. 11, 2020

(54) GOA CIRCUIT

(71) Applicant: Wuhan China Star Optoelectronics Technology Co., LTD, Wuhan, Hubei (CN)

(72) Inventor: Guanghui Hong, Hubei (CN)

(73) Assignee: WUHAN CHINA STAR OPTOELECTRONICS TECHNOLOGY CO., LTD., Wuhan, Hebei (CN)

( * ) Notice: Subject to any disclaimer, the term of this patent is extended or adjusted under 35 U.S.C. 154(b) by 184 days.

(21) Appl. No.: 16/069,273

(22) PCT Filed: Feb. 22, 2018

(86) PCT No.: PCT/CN2018/076954
§ 371 (c)(1),
(2) Date: Jul. 11, 2018

(87) PCT Pub. No.: WO2019/134221
PCT Pub. Date: Jul. 11, 2019

(65) Prior Publication Data
US 2020/0160805 A1    May 21, 2020

(30) Foreign Application Priority Data
Jan. 8, 2018  (CN) .......................... 2018 1 0016691

(51) Int. Cl.
*G09G 3/36*  (2006.01)
(52) U.S. Cl.
CPC ......... *G09G 3/3677* (2013.01); *G09G 3/3696* (2013.01); *G09G 2310/062* (2013.01); *G09G 2310/08* (2013.01)

(58) Field of Classification Search
USPC .......................................... 345/100, 211–213
See application file for complete search history.

(56) References Cited

U.S. PATENT DOCUMENTS 6,975,142 B2 * 12/2005 Azami ............. H03K 19/01714
257/350
7,038,653 B2 *  5/2006 Moon ................... G09G 3/3677
345/100
(Continued)

FOREIGN PATENT DOCUMENTS

CN      104425033 A    3/2015
CN      105096803 A   11/2015
(Continued)

*Primary Examiner* — Tony O Davis
(74) *Attorney, Agent, or Firm* — Leong C. Lei

(57) ABSTRACT

A GOA circuit includes an output module in which a second TFT is arranged. The second TFT has a drain connected to a source of a first TFT, a gate receiving a first control signal, and a source receiving an Mth clock signal. The first control signal controls the second TFT to turn on and off. Alternatively, the drain of the second TFT is connected to the source of the first TFT, the gate receiving the Mth clock signal and the source connected to the first node to allow the second TFT to be conducted on only when the Mth clock signal is a high voltage and the first node is of a high voltage and is cut off at the remaining time. It is possible to prevent a voltage difference from being induced between the source and drain of the first TFT to reduce the electric current stress.

11 Claims, 8 Drawing Sheets

(56) References Cited

U.S. PATENT DOCUMENTS

| | | | | |
|---|---|---|---|---|
| 8,067,775 | B2* | 11/2011 | Miyairi | H01L 21/477 257/72 |
| 8,207,756 | B2* | 6/2012 | Shionoiri | H01L 27/1225 326/98 |
| 2001/0052940 | A1* | 12/2001 | Hagihara | H04N 5/35518 348/302 |
| 2004/0251846 | A1* | 12/2004 | Choi | G09G 3/3233 315/169.3 |
| 2008/0308796 | A1* | 12/2008 | Akimoto | H01L 21/02631 257/43 |
| 2010/0110623 | A1* | 5/2010 | Koyama | H01L 27/1225 361/679.01 |
| 2010/0133533 | A1* | 6/2010 | Umezaki | H01L 27/105 257/43 |
| 2010/0252826 | A1* | 10/2010 | Yamazaki | H01L 27/12 257/43 |
| 2011/0057918 | A1* | 3/2011 | Kimura | H01L 29/78693 345/211 |
| 2011/0084960 | A1* | 4/2011 | Miyake | G09G 3/3266 345/213 |
| 2011/0089417 | A1* | 4/2011 | Yamazaki | H01L 27/1225 257/43 |
| 2011/0089975 | A1* | 4/2011 | Yamazaki | H01L 27/1225 326/102 |
| 2011/0140108 | A1* | 6/2011 | Kimura | H01L 29/247 257/57 |
| 2011/0148497 | A1* | 6/2011 | Ishii | H03K 3/356104 327/210 |
| 2011/0176357 | A1* | 7/2011 | Koyama | G11C 11/412 365/149 |
| 2011/0215787 | A1* | 9/2011 | Shionoiri | H02M 3/158 323/311 |
| 2011/0278564 | A1* | 11/2011 | Yoneda | H01L 27/1214 257/43 |
| 2012/0051117 | A1* | 3/2012 | Yamazaki | G11C 14/0054 365/149 |
| 2012/0063206 | A1* | 3/2012 | Furutani | G11C 11/404 365/149 |
| 2012/0099360 | A1* | 4/2012 | Takemura | G11C 11/412 365/72 |
| 2013/0140617 | A1 | 6/2013 | Umezaki | |
| 2017/0102801 | A1* | 4/2017 | Ko | G06F 3/044 |
| 2018/0350315 | A1* | 12/2018 | Zhang | G09G 3/3677 |
| 2019/0096500 | A1* | 3/2019 | Gu | G11C 19/287 |
| 2019/0180671 | A1* | 6/2019 | Cheng | G09G 3/2092 |

FOREIGN PATENT DOCUMENTS

| | | |
|---|---|---|
| CN | 105206237 A | 12/2015 |
| CN | 105741742 A | 7/2016 |
| CN | 105913826 A | 8/2016 |
| CN | 106104665 A | 11/2016 |

* cited by examiner

GOA CIRCUIT

RELATED APPLICATIONS

The present application is a National Phase of International Application Number PCT/CN2018/076954, filed Feb. 22, 2018, and claims the priority of China Application No. 201810016691.2, filed Jan. 8, 2018.

BACKGROUND OF THE INVENTION

1. Field of the Invention

The present invention relates to the field of display technology, and more particular to a gate-driver-on-array (GOA) circuit.

2. The Related Arts

Liquid crystal display (LCD) has various advantages, such as thin device body, low power consumption, and being free of radiation, and has wide applications, such as liquid crystal televisions, mobile phones, personal digital assistants (PDAs), digital cameras, computer screens, and notebook computer screens, so as to take a leading position in the field of flat panel displays.

Most of the LCDs that are currently available in the market are backlighting LCDs, which comprise a liquid crystal panel and a backlight module. The working principle of the liquid crystal panel is that liquid crystal molecules are filled between a thin-film transistor (TFT) array substrate and a color filter (CF) substrate and a drive voltage is applied between the two substrates to control a rotation direction of the liquid crystal molecules in order to refract out light emitting from the backlight module to generate an image.

In an active liquid crystal display, each pixel is electrically connected with a TFT. The TFT has a gate electrode that is connected to a horizontal scan line, a source electrode connected to a data line in a vertical direction, and a drain electrode connected to a pixel electrode. Application of a sufficient voltage to the horizontal scan line would turn on all the TFTs connected to the horizontal scan line so that signal voltages of the data lines could be written into the pixels to control different light transmittance through liquid crystal to thereby achieve an effect of controlling color and brightness. Driving of the horizontal scan lines of the currently available active liquid crystal display panels is generally carried out with an externally connected integrated circuit (IC). The externally connected IC controls the horizontal scan line of each stage to proceed with charging and discharging in a stage by stage manner.

The gate-driver-on-array (GOA) technology is a row driving technique for an array substrate and allows a gate driver circuit to be formed on a TFT array substrate by using an array manufacturing process of liquid crystal panels in order to achieve a driving operation that realize scanning of gates in a row by row manner. The GOA technology allows for reduction of the operations for bonding the externally connected IC, making it possible to increase productivity and lower down product cost, and also makes the liquid crystal panel more suitable for slim-frame or frame-less display products.

A known GOA circuit comprises multiple stages of GOA unit connected in cascade. Each of the stages of GOA unit comprises a pull-up control module, an output module, and a pull-down module. The output module comprises a first N-type TFT having a gate electrode electrically connected to a first node of the stage of GOA unit, a source electrode connected to and receiving a clock signal, and a drain electrode electrically connected to an output terminal of the stage of GOA unit. In operation, during the time period of one frame, the pull-up control modules of the multiple stages of GOA unit are operable in sequence to convert electric voltages of the first nodes of the multiple stages of GOA units into high voltages that are held for a predetermined period of time and correspondingly, the first N-type TFTs of the output modules of the multiple stages of GOA unit are turned on for a period of time. The clock signal maintains an output of square waves of pulses during the time period of one frame so that during the periods of time in which the first N-type TFTs of the output modules of the multiple stages of GOA unit are turned on, the drain electrodes of the first N-type TFTs output scan signals that correspond to the clock signal. Then, the pull-down modules of the multiple stages of GOA unit sequentially pull down the electric voltages of the first nodes of the multiple stages of GOA units and the electric voltages of output terminals and the low electric voltages are maintained by the pull-down holding module to realize outputting scan signals in a row by row manner. However, in the above GOA circuit, during the time period of one frame, the output terminals of the multiple stages of GOA unit, namely the drain electrodes of the first N-type TFTS of the output modules, would be kept in the low voltage for a very long period of time. The source electrodes, due to receiving inputs of the square waves of the pulses of the clock signal, are set in a high voltage and a low voltage each for a half of the time period of one frame, such that the first N-type TFTs of the output modules have to suffer voltage differences between source and drain electrodes for a very long period of time and causing electric current stress. For operation of an extended period of time, the electrical characteristics of the first N-type TFTs of the output modules would be affected to thereby influence normal operations of turning on and off and thus affecting a normal operation of the GOA circuit, leading to anomalous displaying of the display panel and lowering of product quality.

SUMMARY OF THE INVENTION

An objective of the present invention is to provide a gate-driver-on-array (GOA) circuit, which prevents a voltage difference induced between a source electrode and a drain electrode of a first thin-film transistor (TFT) of an output module so as to lower down the electric current stress and effectively improve product quality.

To achieve the above objectives, the present invention provides a GOA circuit, which comprises multiple stages of GOA unit connected in cascade, each of the stages of GOA unit comprising: a forward/backward scanning control module, an output module, a pull-down module, and a first capacitor;

wherein with N and M being positive integers, in an Nth stage of GOA unit, which excludes first, second, second-to-last, and last stages of GOA unit:

the forward/backward scanning control module receives inputs of a forward scanning signal and a backward scanning signal and is electrically connected to the output terminal of the (N−2)th stage of GOA unit, the output terminal of the (N+2)th stage of GOA unit, and a first node to pull up a voltage level of the first node according to a voltage level the output terminal of the (N−2)th stage of GOA unit, a voltage level of the output terminal of the (N+2)th stage of GOA unit, and the forward scanning signal and the backward scanning signal; the output module comprises a first thin-film transistor and a second thin-film transistor; the first thin-film transistor has a gate electrode electrically connected to the first node, a source electrode electrically connected to a drain electrode of the second thin-film transistor, and a drain electrode electrically connected to the output terminal; the second thin-film transistor has a gate electrode receiving an input of a first control signal and a source electrode receiving an input of an Mth clock signal; the pull-down module receives inputs of an (M+1)th clock signal, an (M−1)th clock signal, the forward scanning signal, the backward scanning signal, a constant high voltage, and a constant low voltage, and is electrically connected to the first node and the output terminal to pull down the voltage level of the first node to the constant low voltage under the control of the (M+1)th clock signal, the (M−1)th clock signal, the forward scanning signal, and the backward scanning signal; the first capacitor has a terminal receiving an input of the constant low voltage and an opposite terminal electrically connected to the first node; the first control signal controls the second thin-film transistor to conduct on when the first node is of a high voltage and the Mth clock signal is a high voltage and to cut off in the remaining time.

The forward/backward scanning control module comprises a third thin-film transistor and a fourth thin-film transistor, wherein the third thin-film transistor has a gate electrode electrically connected to the output terminal of the (N−2)th stage of GOA unit, a source electrode receiving an input of the forward scanning signal, and a drain electrode electrically connected to the first node; and the fourth thin-film transistor has a gate electrode electrically connected to the output terminal of the (N+2)th stage of GOA unit, a source electrode receiving an input of the backward scanning signal, and a drain electrode electrically connected to a drain electrode of the third thin-film transistor; and the pull-down module comprises a fifth thin-film transistor, a sixth thin-film transistor, a seventh thin-film transistor, an eighth thin-film transistor, and a ninth thin-film transistor, wherein the fifth thin-film transistor has a gate electrode receiving an input of the forward scanning signal, a source electrode receiving an input of the (M+1)th clock signal, and a drain electrode electrically connected to a drain electrode of the sixth thin-film transistor; the sixth thin-film transistor has a gate electrode receiving an input of the backward scanning signal and a source electrode receiving an input of the (M−1)th clock signal; the seventh thin-film transistor has a gate electrode electrically connected to the drain electrode of the fifth thin-film transistor, a source electrode receiving an input of the constant high voltage, and a drain electrode electrically connected to a second node; the eighth thin-film transistor has a gate electrode electrically connected to the second node, a source electrode electrically connected to the first node, and a drain electrode receiving an input of the constant low voltage; the ninth thin-film transistor has a gate electrode electrically connected to the second node, a source electrode electrically connected to the output terminal, and a drain electrode receiving an input of the constant low voltage.

Each of the stages of GOA unit further comprises a node control module and a second capacitor; the node control module comprises a tenth thin-film transistor, wherein the tenth thin-film transistor has a gate electrode electrically connected to the first node, a source electrode electrically connected to the second node, and a drain electrode receiving an input of the constant low voltage; the second capacitor has a terminal electrically connected to the second node and an opposite terminal receiving an input of the constant low voltage.

Each of the stages of GOA unit further comprises a voltage stabilization module and a reset module;

wherein the voltage stabilization module comprises an eleventh thin-film transistor, wherein the eleventh thin-film transistor has a gate electrode receiving an input of the constant high voltage and a source electrode and a drain electrode electrically connected to the drain electrode of the third thin-film transistor and the first node, respectively, so as to have the drain electrode of the third thin-film transistor electrically connected to the first node; and the reset module comprises a twelfth thin-film transistor, wherein the twelfth thin-film transistor has a gate electrode and a source electrode both receiving an input of a reset signal and a drain electrode electrically connected to the second node.

In each of the first and second stages of GOA unit, the third thin-film transistor has a gate electrode receiving an input of the circuit start signal;

in each of the second-to-last and last stages of GOA unit, the fourth thin-film transistor has a gate electrode receiving an input of the circuit start signal; and the (M−1)th clock signal, the Mth clock signal, the (M+1)th clock signal have identical pulse periods and have duty cycles that are all ⅓, wherein a falling edge of a previous one of the clock signals and a rising edge of a next one of the clock signal occur at the same time.

The present invention also provides a GOA circuit, which comprises multiple stages of GOA unit connected in cascade, each of the stages of GOA unit comprising: a forward/backward scanning control module, an output module, a pull-down module, and a first capacitor;

wherein with N and M being positive integers, in an Nth stage of GOA unit, which excludes first, second, second-to-last, and last stages of GOA unit:

the forward/backward scanning control module receives inputs of the forward scanning signal and the backward scanning signal and is electrically connected to the output terminal of the (N−2)th stage of GOA unit, the output terminal of the (N+2)th stage of GOA unit and the first node to pull up a voltage level of the first node according to a voltage level the output terminal of the (N−2)th stage of GOA unit, a voltage level of the output terminal of the (N+2)th stage of GOA unit, and the forward scanning signal and the backward scanning signal; the output module comprises a first thin-film transistor and a second thin-film transistor; the first thin-film transistor has a gate electrode electrically connected to the first node, a source electrode electrically connected to a drain electrode of the second thin-film transistor, and a drain electrode electrically connected to the output terminal; the second thin-film transistor has a gate electrode receiving an input of an input of an Mth clock signal and a source electrode electrically connected to the first node; the pull-down module receives inputs of an (M+1)th clock signal, an (M−1)th clock signal, the forward scanning signal, the backward scanning signal, a constant high voltage, and a constant low voltage, and is electrically connected to the first node and the output terminal to pull down the voltage level of the first node to the constant low voltage under the control of the (M+1)th clock signal, the (M−1)th clock signal, the forward scanning signal, and the backward scanning signal; the first capacitor has a terminal receiving an input of the constant low voltage and an opposite terminal electrically connected to the first node; the first control signal controls the second thin-film transistor to conduct on when the first node is of a high voltage and the Mth clock signal is a high voltage and to cut off in the remaining time.

The forward/backward scanning control module comprises a third thin-film transistor and a fourth thin-film transistor, wherein the third thin-film transistor has a gate electrode electrically connected to the output terminal of the (N−2)th stage of GOA unit, a source electrode receiving an input of the forward scanning signal, and a drain electrode electrically connected to the first node; and the fourth thin-film transistor has a gate electrode electrically connected to the output terminal of the (N+2)th stage of GOA unit, a source electrode receiving an input of the backward scanning signal, and a drain electrode electrically connected to a drain electrode of the third thin-film transistor; and the pull-down module comprises a fifth thin-film transistor, a sixth thin-film transistor, a seventh thin-film transistor, an eighth thin-film transistor, and a ninth thin-film transistor, wherein the fifth thin-film transistor has a gate electrode receiving an input of the forward scanning signal, a source electrode receiving an input of the (M+1)th clock signal, and a drain electrode electrically connected to a drain electrode of the sixth thin-film transistor; the sixth thin-film transistor has a gate electrode receiving an input of the backward scanning signal and a source electrode receiving an input of the (M−1)th clock signal; the seventh thin-film transistor has gate electrode electrically connected to the drain electrode of the fifth thin-film transistor, a source electrode receiving an input of the constant high voltage, and a drain electrode electrically connected to a second node; the eighth thin-film transistor has a gate electrode electrically connected to the second node, a source electrode electrically connected to the first node, and a drain electrode receiving an input of the constant low voltage; the ninth thin-film transistor has a gate electrode electrically connected to the second node, a source electrode electrically connected to the output terminal, and a drain electrode receiving an input of the constant low voltage.

Each of the stages of GOA unit further comprises a node control module and a second capacitor; the node control module comprises a tenth thin-film transistor, wherein the tenth thin-film transistor has a gate electrode electrically connected to the first node, a source electrode electrically connected to the second node, and a drain electrode receiving an input of the constant low voltage; the second capacitor has a terminal electrically connected to the second node and an opposite terminal receiving an input of the constant low voltage.

Each of the stages of GOA unit further comprises a voltage stabilization module and a reset module;

wherein the voltage stabilization module comprises an eleventh thin-film transistor, wherein the eleventh thin-film transistor has a gate electrode receiving an input of the constant high voltage and a source electrode and a drain electrode electrically connected to the drain electrode of the third thin-film transistor and the first node, respectively, so as to have the drain electrode of the third thin-film transistor electrically connected to the first node; and the reset module comprises a twelfth thin-film transistor, wherein the twelfth thin-film transistor has a gate electrode and a source electrode both receiving an input of a reset signal and a drain electrode electrically connected to the second node.

In each of the first and second stages of GOA unit, the third thin-film transistor has a gate electrode receiving an input of the circuit start signal;

in each of the second-to-last and last stages of GOA unit, the fourth thin-film transistor has a gate electrode receiving an input of the circuit start signal; and the (M−1)th clock signal, the Mth clock signal, the (M+1)th clock signal have identical pulse periods and have duty cycles that are all ⅓, wherein a falling edge of a previous one of the clock signals and a rising edge of a next one of the clock signal occur at the same time.

The present invention further provides a GOA circuit, which comprises multiple stages of GOA unit connected in cascade, each of the stages of GOA unit comprising: a forward/backward scanning control module, an output module, a pull-down module, and a first capacitor;

wherein with N and M being positive integers, in an Nth stage of GOA unit, which excludes first, second, second-to-last, and last stages of GOA unit:

the forward/backward scanning control module receives inputs of a forward scanning signal and a backward scanning signal and is electrically connected to the output terminal of the (N−2)th stage of GOA unit, the output terminal of the (N+2)th stage of GOA unit, and a first node to pull up a voltage level of the first node according to a voltage level the output terminal of the (N−2)th stage of GOA unit, a voltage level of the output terminal of the (N+2)th stage of GOA unit, and the forward scanning signal and the backward scanning signal; the output module comprises a first thin-film transistor and a second thin-film transistor; the first thin-film transistor has a gate electrode electrically connected to the first node, a source electrode electrically connected to a drain electrode of the second thin-film transistor, and a drain electrode electrically connected to the output terminal; the second thin-film transistor has a gate electrode receiving an input of a first control signal and a source electrode receiving an input of an Mth clock signal; the pull-down module receives inputs of an (M+1)th clock signal, an (M−1)th clock signal, the forward scanning signal, the backward scanning signal, a constant high voltage, and a constant low voltage, and is electrically connected to the first node and the output terminal to pull down the voltage level of the first node to the constant low voltage under the control of the (M+1)th clock signal, the (M−1)th clock signal, the forward scanning signal, and the backward scanning signal; the first capacitor has a terminal receiving an input of the constant low voltage and an opposite terminal electrically connected to the first node; the first control signal controls the second thin-film transistor to conduct on when the first node is of a high voltage and the Mth clock signal is a high voltage and to cut off in the remaining time;

wherein the forward/backward scanning control module comprises a third thin-film transistor and a fourth thin-film transistor, wherein the third thin-film transistor has a gate electrode electrically connected to the output terminal of the (N−2)th stage of GOA unit, a source electrode receiving an input of the forward scanning signal, and a drain electrode electrically connected to the first node; and the fourth thin-film transistor has a gate electrode electrically connected to the output terminal of the (N+2)th stage of GOA unit, a source electrode receiving an input of the backward scanning signal, and a drain electrode electrically connected to a drain electrode of the third thin-film transistor; and the pull-down module comprises a fifth thin-film transistor, a sixth thin-film transistor, a seventh thin-film transistor, an eighth thin-film transistor, and a ninth thin-film transistor, wherein the fifth thin-film transistor has a gate electrode receiving an input of the forward scanning signal, a source electrode receiving an input of the (M+1)th clock signal, and a drain electrode electrically connected to a drain electrode of the sixth thin-film transistor; the sixth thin-film transistor has a gate electrode receiving an input of the backward scanning signal and a source electrode receiving an input of the (M−1)th clock signal; the seventh thin-film transistor has gate electrode electrically connected to the drain electrode of the fifth thin-film transistor, a source electrode receiving an input of the constant high voltage, and a drain electrode electrically connected to a second node; the eighth thin-film transistor has a gate electrode electrically connected to the second node, a source electrode electrically connected to the first node, and a drain electrode receiving an input of the constant low voltage; the ninth thin-film transistor has a gate electrode electrically connected to the second node, a source electrode electrically connected to the output terminal, and a drain electrode receiving an input of the constant low voltage:

wherein each of the stages of GOA unit further comprises a node control module and a second capacitor; the node control module comprises a tenth thin-film transistor, wherein the tenth thin-film transistor has a gate electrode electrically connected to the first node, a source electrode electrically connected to the second node, and a drain electrode receiving an input of the constant low voltage; the second capacitor has a terminal electrically connected to the second node and an opposite terminal receiving an input of the constant low voltage;

wherein each of the stages of GOA unit further comprises a voltage stabilization module and a reset module;

wherein the voltage stabilization module comprises an eleventh thin-film transistor, wherein the eleventh thin-film transistor has a gate electrode receiving an input of the constant high voltage and a source electrode and a drain electrode electrically connected to the drain electrode of the third thin-film transistor and the first node, respectively, so as to have the drain electrode of the third thin-film transistor electrically connected to the first node; and the reset module comprises a twelfth thin-film transistor, wherein the twelfth thin-film transistor has a gate electrode and a source electrode both receiving an input of a reset signal and a drain electrode electrically connected to the second node; and wherein in each of the first and second stages of GOA unit, the third thin-film transistor has a gate electrode receiving an input of the circuit start signal;

in each of the second-to-last and last stages of GOA unit, the fourth thin-film transistor has a gate electrode receiving an input of the circuit start signal; and the (M−1)th clock signal, the Mth clock signal, the (M+1)th clock signal have identical pulse periods and have duty cycles that are all ⅓, wherein a falling edge of a previous one of the clock signals and a rising edge of a next one of the clock signal occur at the same time.

The efficacy of the present invention is that the present invention provides a GOA circuit, which comprises an output module in which a second thin-film transistor is arranged, wherein the second thin-film transistor has a drain electrode electrically connected to a source electrode of a first thin-film transistor, a gate electrode receiving an input of a first control signal, and a source electrode receiving an input of an Mth clock signal so that the first control signal can be used to control the second thin-film transistor to turn on and off, or alternatively, the drain electrode of the second thin-film transistor is electrically connected to the source electrode of the first thin-film transistor, the gate electrode thereof receiving an input of the Mth clock signal and the source electrode thereof electrically connected to the first node to allow the second thin-film transistor to be conducted on only when the Mth clock signal is a high voltage and the first node is of a high voltage and is cut off at the remaining time, whereby it is possible to prevent a voltage difference from being induced between the source and drain electrodes of the first thin-film transistor to reduce the electric current stress that it bears and thus effectively improve product quality.

BRIEF DESCRIPTION OF THE DRAWINGS

For better understanding of the features and technical contents of the present invention, reference will be made to the following detailed description of the present invention, in combination with the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Referring to FIGS. 1-4, a first embodiment of a gate-driver-on-array (GOA) circuit according to the present invention is shown. The first embodiment of the GOA circuit according to the present invention comprises multiple stages of GOA unit connected in cascade and each of the stages of GOA unit comprises: a forward/backward scanning control module 100, an output module 200, a pull-down module 300, and a first capacitor C1.

Figure 1:
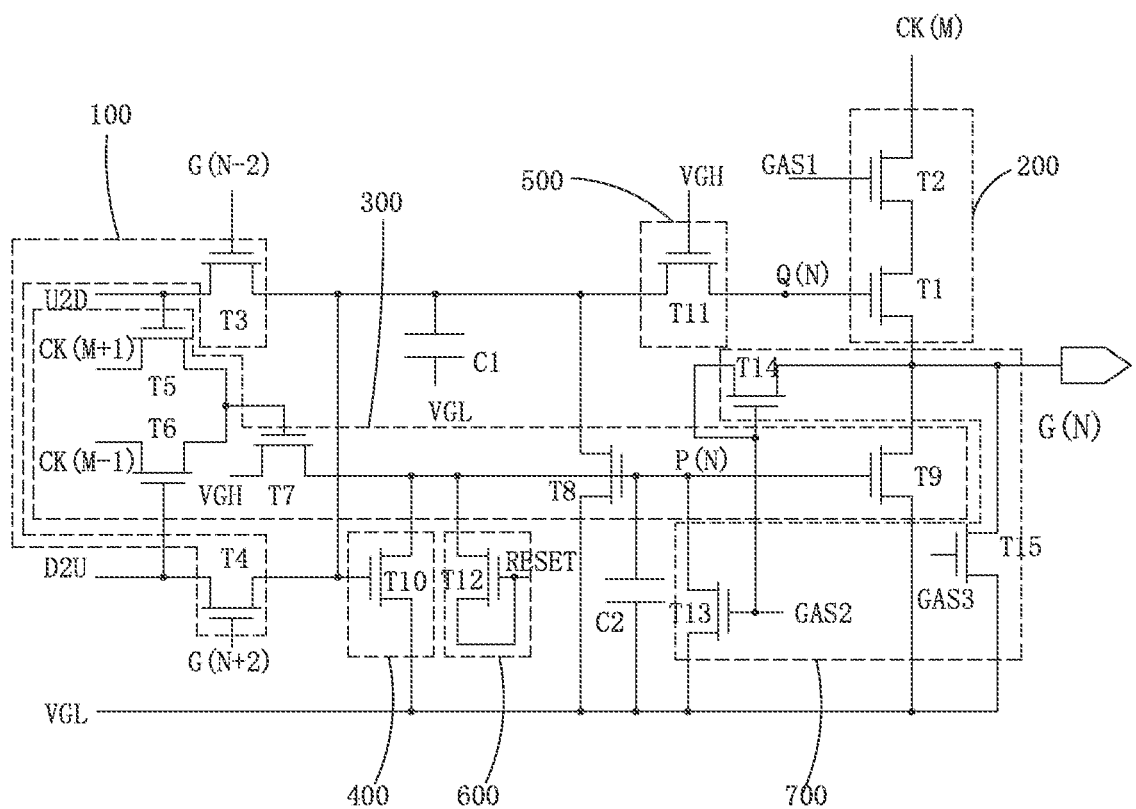
FIG. 1 is a circuit diagram of a first embodiment of a gate-driver-on-array (GOA) circuit according to the present invention.

Referring to FIG. 1, with N and M being positive integers, excluding a first stage, a second stage, a second-to-last stage, and a last stage of GOA unit, in an Nth stage of GOA unit:

the forward/backward scanning control module 100 receives inputs of a forward scanning signal U2D and a backward scanning signal D2U and is electrically connected to the output terminal G(N−2) of the (N−2)th stage of GOA unit, the output terminal G(N+2) of the (N+2)th stage of GOA unit, and a first node Q(N) to pull up a voltage level of the first node Q(N) according to a voltage level the output terminal G(N−2) of the (N−2)th stage of GOA unit, a voltage level of the output terminal G(N+2) of the (N+2)th stage of GOA unit, and the forward scanning signal U2D and the backward scanning signal D2U; the output module 200 comprises a first thin-film transistor T1 and a second thin-film transistor T2; the first thin-film transistor T1 has a gate electrode electrically connected to the first node Q(N), a source electrode electrically connected to a drain electrode of the second thin-film transistor T2, and a drain electrode electrically connected to the output terminal G(N); the second thin-film transistor T2 has a gate electrode receiving an input of a first control signal GAS1 and a source electrode receiving an input of an Mth clock signal CK(M); the pull-down module 300 receives inputs of an (M+1)th clock signal CK(M+1), an (M−1)th clock signal CK(M−1), the forward scanning signal U2D, the backward scanning signal D2U, a constant high voltage VGH, and a constant low voltage VGL, and is electrically connected to the first node Q(N) and the output terminal G(N) to pull down the voltage level of the first node Q(N) to the constant low voltage VGL under the control of the (M+1)th clock signal CK(M+1), the (M−1)th clock signal CK(M−1), the forward scanning signal U2D, and the backward scanning signal D2U; the first capacitor C1 has a terminal receiving an input of the constant low voltage VGL and an opposite terminal electrically connected to the first node Q(N); the first control signal GAS1 controls the second thin-film transistor T2 to conduct on when the first node Q(N) is of a high voltage and the Mth clock signal CK(M) is a high voltage and to cut off in the remaining time.

Specifically, referring to FIG. 1, the forward/backward scanning control module 100 comprises a third thin-film transistor T3 and a fourth thin-film transistor T4, wherein the third thin-film transistor T3 has a gate electrode electrically connected to the output terminal G(N−2) of the (N−2)th stage of GOA unit, a source electrode receiving an input of the forward scanning signal U2D, and a drain electrode electrically connected to the first node Q(N); and the fourth thin-film transistor T4 has a gate electrode electrically connected to the output terminal G(N+2) of the (N+2)th stage of GOA unit, a source electrode receiving an input of the backward scanning signal D2U, and a drain electrode electrically connected to a drain electrode of the third thin-film transistor T3.

The pull-down module 300 comprises a fifth thin-film transistor T5, a sixth thin-film transistor T6, a seventh thin-film transistor T7, an eighth thin-film transistor T8, and a ninth thin-film transistor T9, wherein the fifth thin-film transistor T5 has a gate electrode receiving an input of the forward scanning signal U2D, a source electrode receiving an input of the (M+1)th clock signal CK(M+1), and a drain electrode electrically connected to a drain electrode of the sixth thin-film transistor T6; the sixth thin-film transistor T6 has a gate electrode receiving an input of the backward scanning signal D2U and a source electrode receiving an input of the (M−1)th clock signal CK(M−1); the seventh thin-film transistor T7 has gate electrode electrically connected to the drain electrode of the fifth thin-film transistor T5, a source electrode receiving an input of the constant high voltage VGH, and a drain electrode electrically connected to a second node P(N); the eighth thin-film transistor T8 has a gate electrode electrically connected to the second node P(N), a source electrode electrically connected to the first node Q(N), and a drain electrode receiving an input of the constant low voltage VGL; the ninth thin-film transistor T9 has a gate electrode electrically connected to the second node P(N), a source electrode electrically connected to the output terminal G(N), and a drain electrode receiving an input of the constant low voltage VGL.

Specifically, referring to FIG. 1, each of the stages of GOA unit further comprises a node control module 400 and a second capacitor C2; the node control module 400 comprises a tenth thin-film transistor T10, wherein the tenth thin-film transistor T10 has a gate electrode electrically connected to the first node Q(N), a source electrode electrically connected to the second node P(N), and a drain electrode receiving an input of the constant low voltage VGL; the second capacitor C2 has a terminal electrically connected to the second node P(N) and an opposite terminal receiving an input of the constant low voltage VGL.

Specifically, referring to FIG. 1, each of the stages of GOA unit further comprises a voltage stabilization module 500 and a reset module 600;

wherein the voltage stabilization module 500 comprises an eleventh thin-film transistor T11, wherein the eleventh thin-film transistor T11 has a gate electrode receiving an input of the constant high voltage VGH and a source electrode and a drain electrode electrically connected to the drain electrode of the third thin-film transistor T3 and the first node Q(N), respectively, so as to have the drain electrode of the third thin-film transistor T3 electrically connected to the first node Q(N); and the reset module 600 comprises a twelfth thin-film transistor T12, wherein the twelfth thin-film transistor T12 has a gate electrode and a source electrode both receiving an input of a reset signal RESET and a drain electrode electrically connected to the second node P(N).

Figure 3:
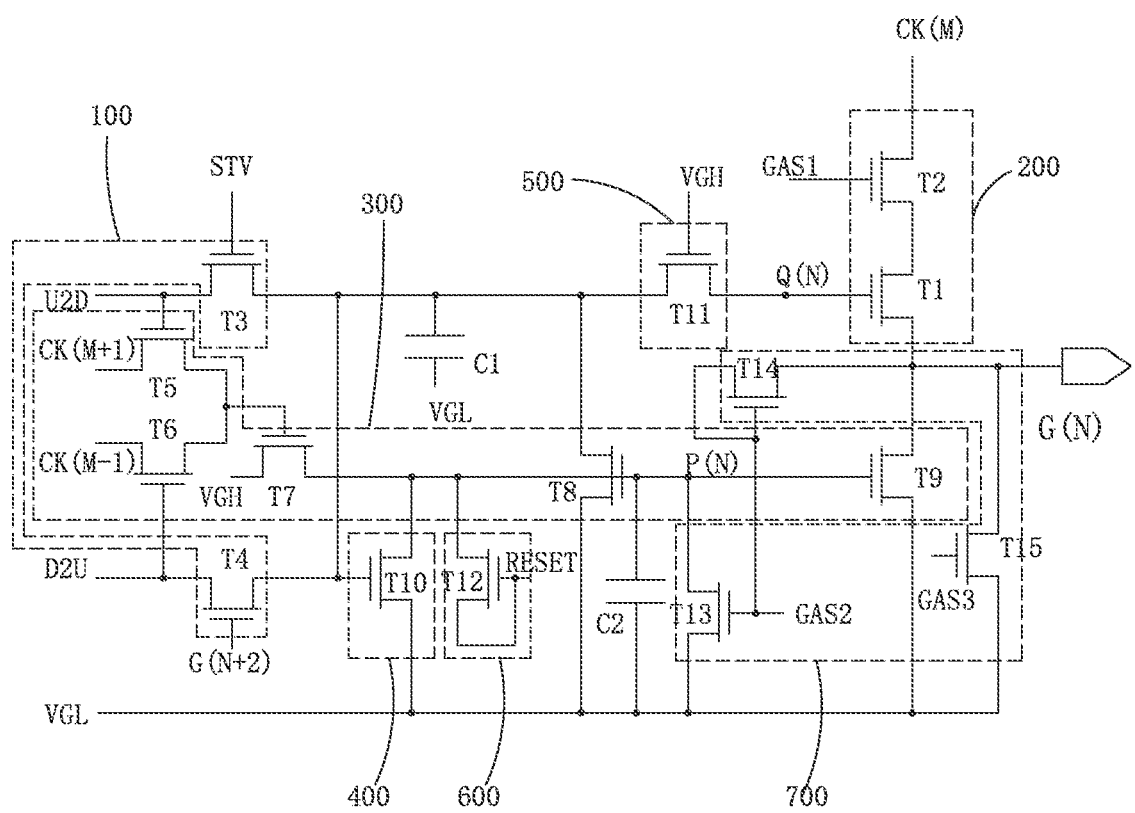
FIG. 3 is a circuit diagram of a first stage and a second stage of GOA unit of the first embodiment of the GOA circuit according to the present invention.

Specifically, referring to FIG. 3, in the first and second stages of GOA unit, the third thin-film transistor T3 has a gate electrode receiving an input of a circuit start signal STV, while the remaining part is identical to that of the remaining stages of GOA unit.

Figure 4:
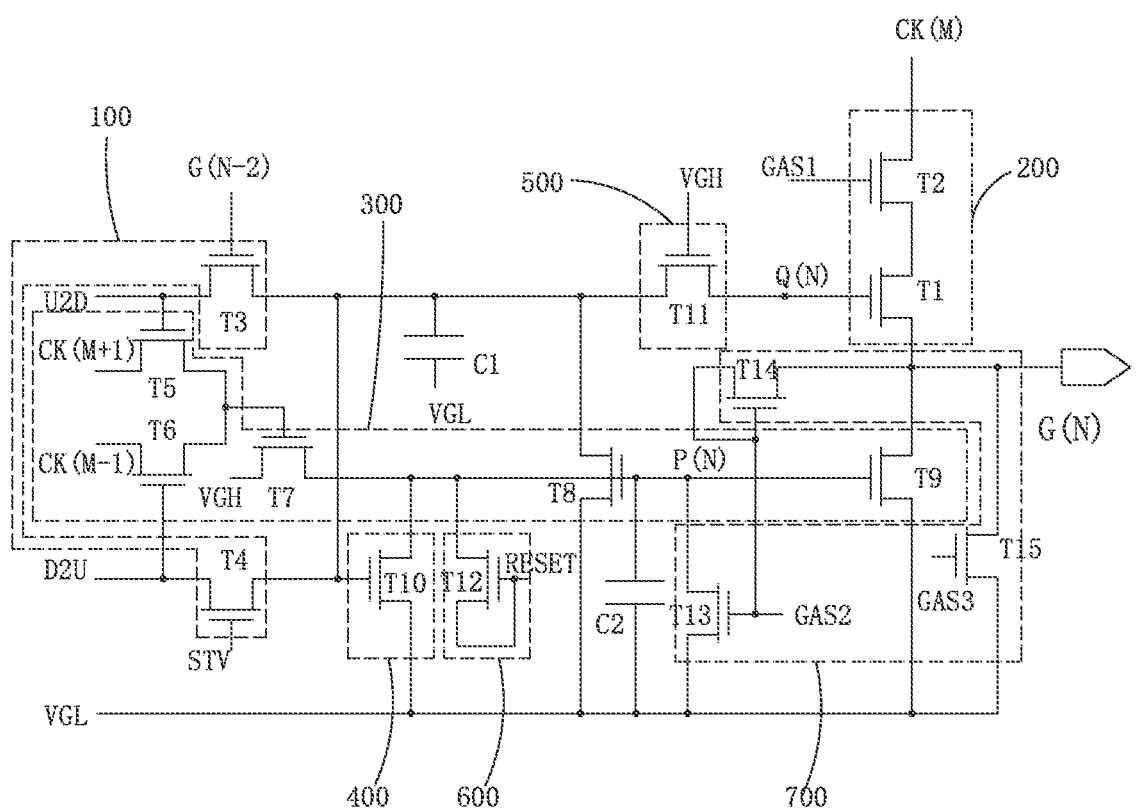
FIG. 4 is a circuit diagram of a second-to-last stage and a last stage of GOA unit of the first embodiment of the GOA circuit according to the present invention.

Specifically, referring to FIG. 4, in the second-to-last and last stages of GOA unit, the fourth thin-film transistor T4 has a gate electrode receiving an input of the circuit start signal STV, while the remaining part is identical to that of the remaining stages of GOA unit.

Figure 2:
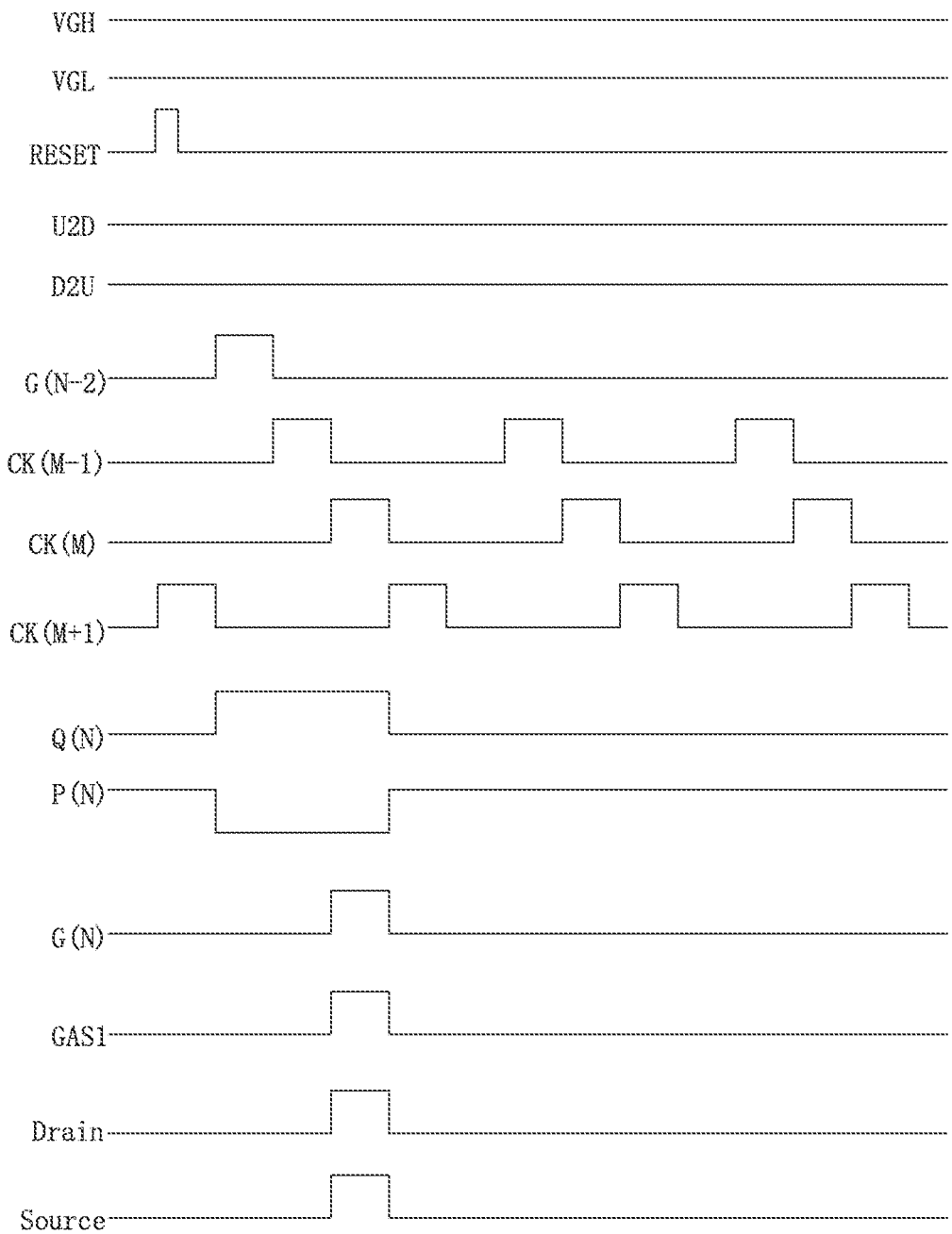
FIG. 2 is a timing diagram of forward scanning of the first embodiment of the GOA circuit according to the present invention.

Specifically, referring to FIG. 2, the (M−1)th clock signal CK(M−1), the Mth clock signal CK(M), the (M+1)th clock signal CK(M+1) have identical pulse periods and have duty cycles that are all ⅓, wherein a falling edge of a previous one of the clock signals and a rising edge of of a next one of the clock signal occur at the same time.

Specifically, in a forward scanning operation, the forward scanning signal U2D is set to a high voltage level and the backward scanning signal D2U is set to a low voltage level, preferably, the forward scanning signal U2D being the constant high voltage VGH and the backward scanning signal D2U being the constant low voltage VGL; in a backward scanning operation, the forward scanning signal U2D is set to a low voltage level and the backward scanning signal D2U is set to a high voltage level, preferably, the forward scanning signal U2D being the constant low voltage VGL and the backward scanning signal D2U being the constant high voltage VGH.

Specifically, the reset signal RESET has a high voltage level that is the constant high voltage VGH and a low voltage level that is the constant low voltage VGL.

Specifically, the (M−1)th clock signal CK(M−1), the Mth clock signal CK(M), and the (M+1)th clock signal CK(M+1) each have a high voltage level that is the constant high voltage VGH and a low voltage level that is the constant low voltage VGL.

Specifically, referring to FIG. 1, each of the stages of GOA unit further comprises a global control module 700; the global control module 700 comprises a thirteenth thin-film transistor T13, a fourteenth thin-film transistor T14, and a fifteenth thin-film transistor T15, wherein the thirteenth thin-film transistor T13 has a gate electrode receiving an input of a second control signal GAS2, a source electrode electrically connected to the second node P(N), and a drain electrode receiving an input of the constant low voltage VGL; the fourteenth thin-film transistor T14 has a gate electrode and a source electrode both receiving an input of the second control signal GAS2 and a drain electrode electrically connected to the output terminal G(N); the fifteenth thin-film transistor T15 has a gate electrode receiving an input of a third control signal GAS3, a source electrode electrically connected to the output terminal G(N), and a drain electrode receiving an input of the constant low voltage VGL. The global control module 700 functions to control the voltage levels of the second node P(N) and the output terminal G(N) under the control of the second control signal GAS2 and the third control signal GAS3 in order to achieve a touch control function.

Specifically, the first, second, third, fourth, fifth, sixth, seventh, eighth, ninth, tenth, eleventh, twelfth, thirteenth, fourteenth, and fifteenth thin-film transistor T1, T2. T3, T4, T5, T6, T7, T8, T9, T10, T11, T12, T13, T14, T15 are all N-type thin-film transistors.

Specifically, referring to FIG. 1 in combination with FIG. 2, operation of the first embodiment of the GOA circuit according to the present invention will be described by taking forward scanning as an example. Firstly, the voltage level the output terminal G(N−2) of the (N−2)th stage of GOA unit is set to a high voltage, and the third thin-film transistor T3 is conducted on so that a high voltage is written into the first node Q(N). At this moment, the Mth clock signal CK(M) is of a low voltage, and correspondingly, the first control signal GAS1 is also a low voltage to control the second thin-film transistor T2 to cut off. Under this condition, the source electrode (Source) and the drain electrode (Drain) of the first thin-film transistor T1 are both of a low voltage, making no voltage difference therebetween, and thus, the first thin-film transistor T1 bears no electric current stress. Afterwards, the Mth clock signal CK(M) is turned into a high voltage, and at this moment, due to the effect of the first capacitor C1, the voltage level of the first node Q(N) is still kept at the high voltage to conduct on the first thin-film transistor T1 and correspondingly, the first control signal GAS1 is turned into a high voltage to control the second thin-film transistor T2 to conduct on. The high voltage of the Mth clock signal CK(M) is transmitted to the source electrode (Source) of the first thin-film transistor T1, and the drain electrode (Drain) of the first thin-film transistor T1 then supplies an output of the high voltage at the output terminal G(N). Afterwards, the Mth clock signal CK(M) is turned into a low voltage and the (M+1)th clock signal CK(M+1) becomes a high voltage, so that the fifth thin-film transistor T5, due to the gate electrode thereof receiving an input of the forward scanning signal U2D, is conducted on and the high voltage of the (M+1)th clock signal CK(M+1) is written through the fifth thin-film transistor T5 into the gate electrode of the seventh thin-film transistor T7 to conduct on and the constant high voltage VGH is written through the conducted-on the seventh thin-film transistor T7 into the second node P(N), making both the eighth thin-film transistor T8 and the ninth thin-film transistor T9 conducted on, and the voltage level of the first node Q(N) and the output terminal G(N), namely the drain electrode (Drain) of the first thin-film transistor T1, both being the constant low voltage VGL, and correspondingly, the first control signal GAS1 is a low voltage to control the second thin-film transistor T2 to cut off. At this moment, the source electrode (Source) and the drain electrode (Drain) of the first thin-film transistor T1 are both of a low voltage, making no voltage difference therebetween, and thus, the first thin-film transistor T1 bears no electric current stress, until the next time when the first node Q(N) and the Mth clock signal CK(M) are both set to high voltages, where the first control signal GAS1 is turned again into a high voltage to control the second thin-film transistor T2 to conduct on. Thus, in the first embodiment of the GOA circuit of the present invention, except when the Mth clock signal is a high voltage and the first node Q(N) is set at a high voltage, namely only when the output terminal G(N) outputs a high voltage at the timing necessary to conduct a scanning operation, the second thin-film transistor T2 is kept cut off in order to disconnect the source electrode (Source) of the first thin-film transistor T1 from the Mth clock signal CK(M) and keeps the source electrode (Source) of the first thin-film transistor T1 from being affected by the square waves of the pulses of the Mth clock signal CK(M) for holding the low voltage, whereby at any time other than when the output terminal G(N) is set to output the high voltage, no voltage difference is induced between the source and drain electrodes of the first thin-film transistor T1 and thus, the electric current stress that it bears is reduced to prevent the characteristics of the first thin-film transistor T1 from being affected by the electric current stress and thus influencing the performance of the GOA circuit, so as to effectively improve product quality.

Referring to FIG. 5-8, a second embodiment of the GOA circuit to the present invention is shown. The first embodiment of the GOA circuit according to the present invention comprises the multiple stages of GOA unit connected in cascade and each of the stages of GOA unit comprises: a forward/backward scanning control module 100, an output module 200', a pull-down module 300, and a first capacitor C1.

Figure 5:
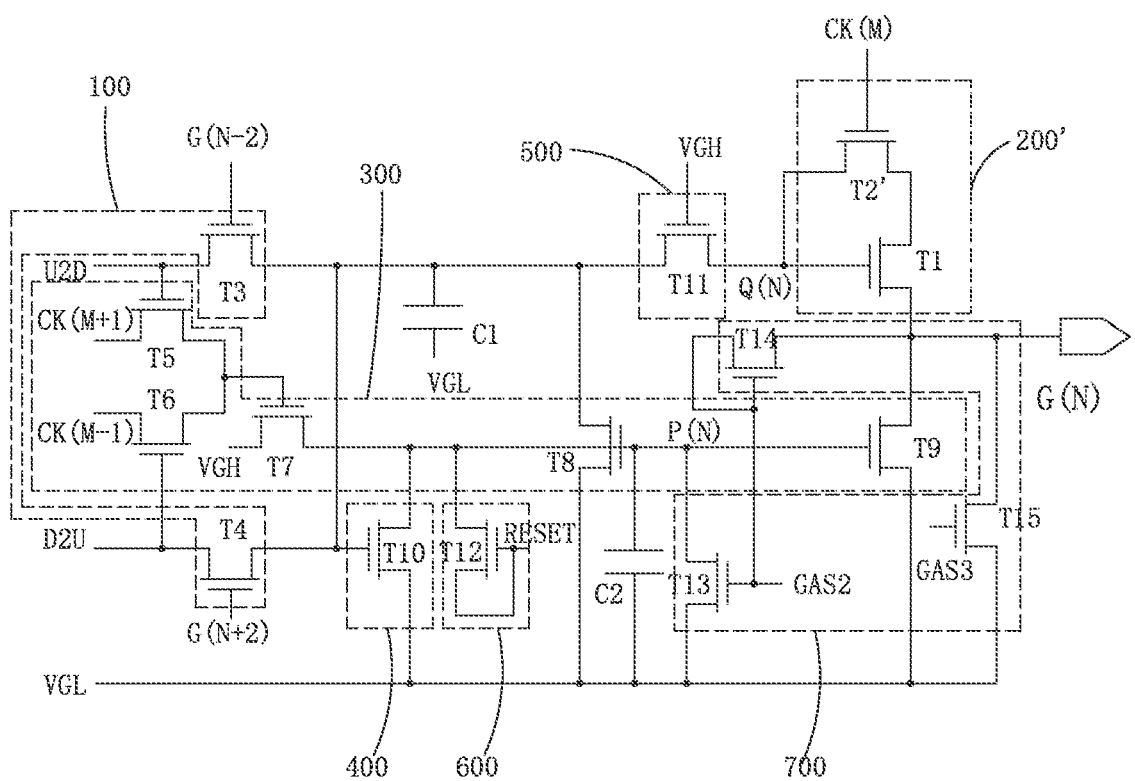
FIG. 5 is a circuit diagram of a second embodiment of a GOA circuit according to the present invention.

Referring to FIG. 5, with N and M being positive integers, excluding a first stage, a second stage, a second-to-last stage, and a last stage of GOA unit, in an Nth stage of GOA unit:

The forward/backward scanning control module 100 receives inputs of the forward scanning signal U2D and the backward scanning signal D2U and is electrically connected to the output terminal G(N−2) of the (N−2)th stage of GOA unit, the output terminal G(N+2) of the (N+2)th stage of GOA unit and the first node Q(N) to pull up a voltage level of the first node Q(N) according to a voltage level the output terminal G(N−2) of the (N−2)th stage of GOA unit, a voltage level of the output terminal G(N+2) of the (N+2)th stage of GOA unit, and the forward scanning signal U2D and the backward scanning signal D2U; the output module 200' comprises a first thin-film transistor T1 and a second thin-film transistor T2'; the first thin-film transistor T1 has a gate electrode electrically connected to the first node Q(N), a source electrode electrically connected to a drain electrode of the second thin-film transistor T2', and a drain electrode electrically connected to the output terminal G(N); the second thin-film transistor T2' has a gate electrode receiving an input of an input of an Mth clock signal CK(M) and a source electrode electrically connected to the first node Q(N); the pull-down module 300 receives inputs of an (M+1)th clock signal CK(M+1), an (M−1)th clock signal CK(M−1), the forward scanning signal U2D, the backward scanning signal D2U, a constant high voltage VGH, and a constant low voltage VGL, and is electrically connected to the first node Q(N) and the output terminal G(N) to pull down the voltage level of the first node Q(N) to the constant low voltage VGL under the control of the (M+1)th clock signal CK(M+1), the (M−1)th clock signal CK(M−1), the forward scanning signal U2D, and the backward scanning signal D2U; the first capacitor C1 has a terminal receiving an input of the constant low voltage VGL and an opposite terminal electrically connected to the first node Q(N); the first control signal GAS1 controls the second thin-film transistor T2 to conduct on when the first node Q(N) is of a high voltage and the Mth clock signal CK(M) is a high voltage and to cut off in the remaining time.

Specifically, referring to FIG. 5, the forward/backward scanning control module 100 comprises a third thin-film transistor T3 and a fourth thin-film transistor T4, wherein the third thin-film transistor T3 has a gate electrode electrically connected to the output terminal G(N−2) of the (N−2)th stage of GOA unit, a source electrode receiving an input of the forward scanning signal U2D, and a drain electrode electrically connected to the first node Q(N); and the fourth thin-film transistor T4 has a gate electrode electrically connected to the output terminal G(N+2) of the (N+2)th stage of GOA unit, a source electrode receiving an input of the backward scanning signal D2U, and a drain electrode electrically connected to a drain electrode of the third thin-film transistor T3.

The pull-down module 300 comprises a fifth thin-film transistor T5, a sixth thin-film transistor T6, a seventh thin-film transistor T7, an eighth thin-film transistor T8, and a ninth thin-film transistor T9; the fifth thin-film transistor T5 has a gate electrode receiving an input of the forward scanning signal U2D, a source electrode receiving an input of the (M+1)th clock signal CK(M+1), and a drain electrode electrically connected to a drain electrode of the sixth thin-film transistor T6; the sixth thin-film transistor T6 has a gate electrode receiving an input of the backward scanning signal D2U and a source electrode receiving an input of the (M−1)th clock signal CK(M−1); the seventh thin-film transistor T7 has gate electrode electrically connected to the drain electrode of the fifth thin-film transistor T5, a source electrode receiving an input of the constant high voltage VGH, and a drain electrode electrically connected to a second node P(N); the eighth thin-film transistor T8 has a gate electrode electrically connected to the second node P(N), a source electrode electrically connected to the first node Q(N), and a drain electrode receiving an input of the constant low voltage VGL; the ninth thin-film transistor T9 has a gate electrode electrically connected to the second node P(N), a source electrode electrically connected to the output terminal G(N), and a drain electrode receiving an input of the constant low voltage VGL.

Specifically, referring to FIG. 5, each of the stages of GOA unit further comprises a node control module 400 and a second capacitor C2; the node control module 400 comprises a tenth thin-film transistor T10, wherein the tenth thin-film transistor T10 has a gate electrode electrically connected to the first node Q(N), a source electrode electrically connected to the second node P(N), and a drain electrode receiving an input of the constant low voltage VGL; the second capacitor C2 has a terminal electrically connected to the second node P(N) and an opposite terminal receiving an input of the constant low voltage VGL.

Specifically, referring to FIG. 5, each of the stages of GOA unit further comprises a voltage stabilization module 500 and a reset module 600;
wherein the voltage stabilization module 500 comprises an eleventh thin-film transistor T11, wherein the eleventh thin-film transistor T11 has a gate electrode receiving an input of the constant high voltage VGH and a source electrode and a drain electrode electrically connected to the drain electrode of the third thin-film transistor T3 and the first node Q(N), respectively, so as to have the drain electrode of the third thin-film transistor T3 electrically connected to the first node Q(N); and the reset module 600 comprises a twelfth thin-film transistor T12, wherein the twelfth thin-film transistor T12 has a gate electrode and a source electrode both receiving an input of a reset signal RESET and a drain electrode electrically connected to the second node P(N).

Figure 7:
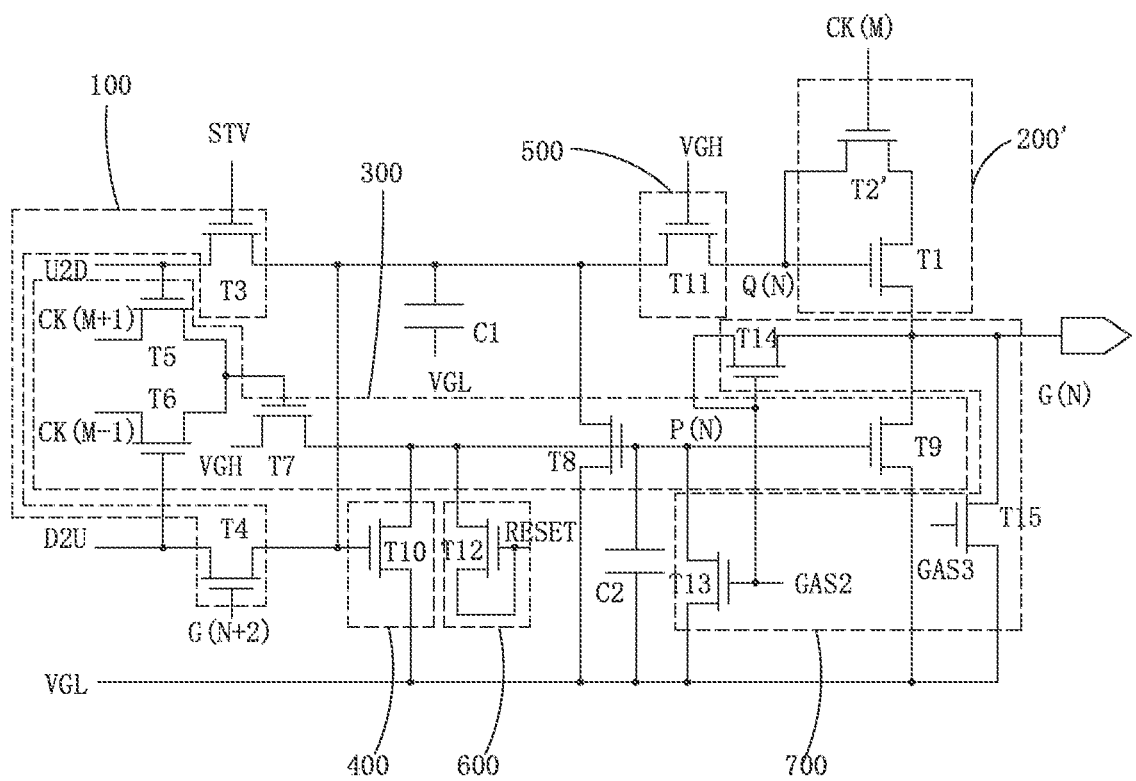
FIG. 7 is a circuit diagram of a first stage and a second stage of GOA unit of the second embodiment of the GOA circuit according to the present invention.

Specifically, referring to FIG. 7, in the first and second stages of GOA unit, the third thin-film transistor T3 has a gate electrode receiving an input of a circuit start signal STV, while the remaining part is identical to that of the remaining stages of GOA unit.

Figure 8:
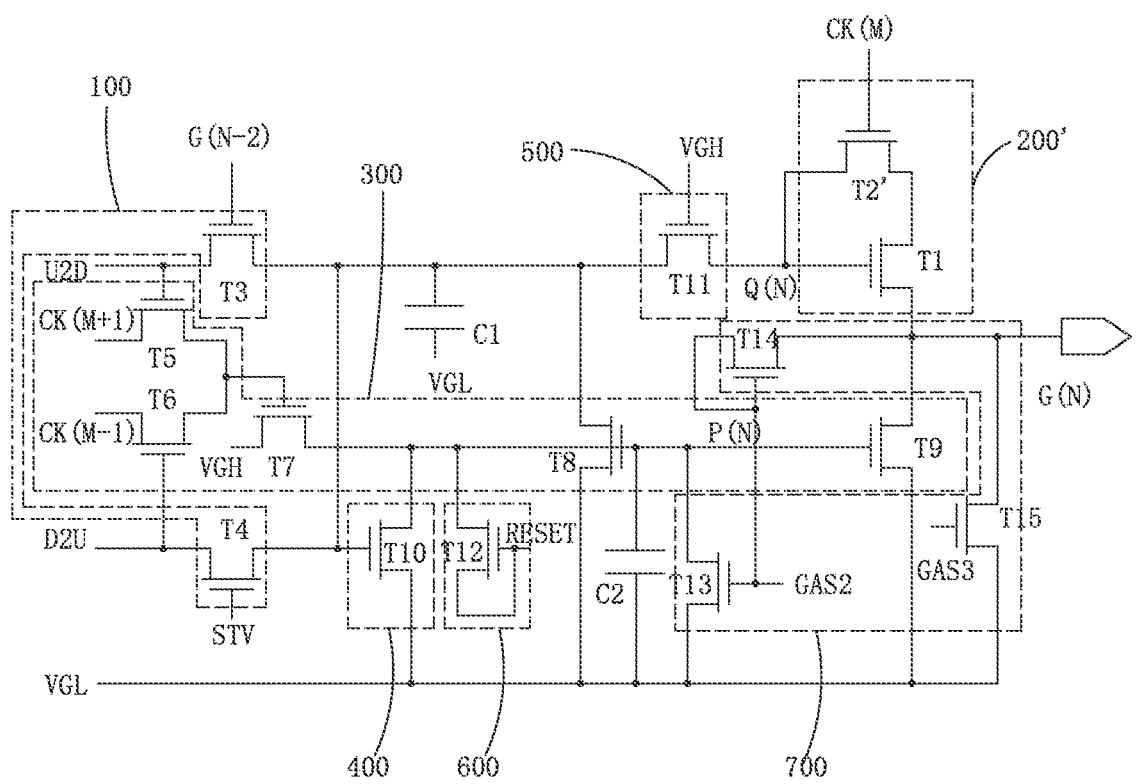
FIG. 8 is a circuit diagram of a second-to-last stage and a last stage of GOA unit of the second embodiment of the GOA circuit according to the present invention.

Specifically, referring to FIG. 8, in the second-to-last and last stages of GOA unit, the fourth thin-film transistor T4 has a gate electrode receiving an input of the circuit start signal STV, while the remaining part is identical to that of the remaining stages of GOA unit.

Figure 6:
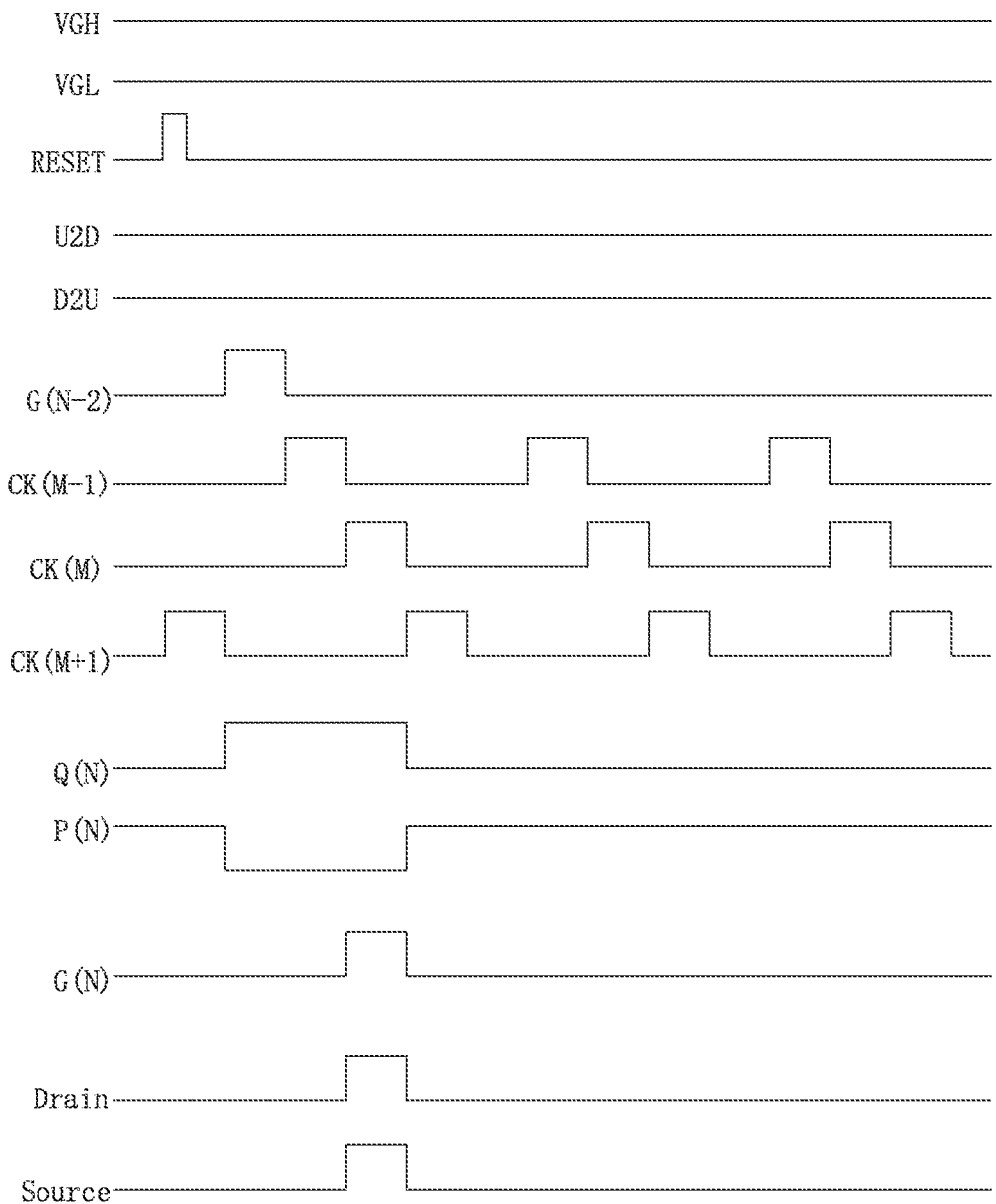
FIG. 6 is a timing diagram of forward scanning of the second embodiment of the GOA circuit according to the present invention.

Specifically, referring to FIG. 6, the (M−1)th clock signal CK(M−1), the Mth clock signal CK(M), the (M+1)th clock signal CK(M+1) have identical pulse periods and have duty cycles that are all ⅓, wherein a falling edge of a previous one of the clock signals and a rising edge of of a next one of the clock signal occur at the same time.

Specifically, in a forward scanning operation, the forward scanning signal U2D is set to a high voltage level and the backward scanning signal D2U is set to a low voltage level, preferably, the forward scanning signal U2D being the constant high voltage VGH and the backward scanning signal D2U being the constant low voltage VGL; in a backward scanning operation, the forward scanning signal U2D is set to a low voltage level and the backward scanning signal D2U is set to a high voltage level, preferably, the forward scanning signal U2D being the constant low voltage VGL and the backward scanning signal D2U being the constant high voltage VGH.

Specifically, the reset signal RESET has a high voltage level that is the constant high voltage VGH and a low voltage level that is the constant low voltage VGL.

Specifically, the (M−1)th clock signal CK(M−1), the Mth clock signal CK(M), and the (M+1)th clock signal CK(M+1) each have a high voltage level that is the constant high voltage VGH and a low voltage level that is the constant low voltage VGL.

Specifically, referring to FIG. 5, each of the stages of GOA unit further comprises a global control module 700; the global control module 700 comprises a thirteenth thin-film transistor T13, a fourteenth thin-film transistor T14, and a fifteenth thin-film transistor T15, wherein the thirteenth thin-film transistor T13 has a gate electrode receiving an input of a second control signal GAS2, a source electrode electrically connected to the second node P(N), and a drain electrode receiving an input of the constant low voltage VGL; the fourteenth thin-film transistor T14 has a gate electrode and a source electrode both receiving an input of the second control signal GAS2 and a drain electrode electrically connected to the output terminal G(N); the fifteenth thin-film transistor T15 has a gate electrode receiving an input of a third control signal GAS3, a source electrode electrically connected to the output terminal G(N), and a drain electrode receiving an input of the constant low voltage VGL. The global control module 700 functions to control the voltage levels of the second node P(N) and the output terminal G(N) under the control of the second control signal GAS2 and the third control signal GAS3 in order to achieve a touch control function.

Specifically, the first, second, third, fourth, fifth, sixth, seventh, eighth, ninth, tenth, eleventh, twelfth, thirteenth, fourteenth, and fifteenth thin-film transistor T1, T2. T3, T4, T5, T6, T7, T8, T9, T10, T11, T12, T13, T14, T15 are all N-type thin-film transistors.

Specifically, referring to FIG. 5 in combination with FIG. 6, operation of the second embodiment of the GOA circuit according to the present invention will be described by taking forward scanning as an example. Firstly, the voltage level the output terminal G(N−2) of the (N−2)th stage of GOA unit is set to a high voltage, and the third thin-film transistor T3 is conducted on so that a high voltage is written into the first node Q(N). At this moment, the Mth clock signal CK(M) is of a low voltage, and the second thin-film transistor T2' is cut off. Under this condition, the source electrode (Source) and the drain electrode (Drain) of the first thin-film transistor T1 are both of a low voltage, making no voltage difference therebetween, and thus, the first thin-film transistor T1 bears no electric current stress. Afterwards, the Mth clock signal CK(M) is turned into a high voltage so as to make the second thin-film transistor T2' conducted on and at this moment, due to the effect of the first capacitor C1, the voltage level of the first node Q(N) is still kept at the high voltage to conduct on the first thin-film transistor T1 and high voltage of the first node Q(N) is transmitted through the conducted-on the second thin-film transistor T2' to write into the source electrode (Source) of the first thin-film transistor T1, and the drain electrode (Drain) of the first thin-film transistor T1 then supplies an output of the high voltage at the output terminal G(N). Afterwards, the Mth clock signal CK(M) is turned into a low voltage and the (M+1)th clock signal CK(M+1) becomes a high voltage, so that the fifth thin-film transistor T5, due to the gate electrode thereof receiving an input of the forward scanning signal U2D, is conducted on and the high voltage of the (M+1)th clock signal CK(M+1) is written through the fifth thin-film transistor T5 into the gate electrode of the seventh thin-film transistor T7 to conduct on and the constant high voltage VGH is written through the conducted-on the seventh thin-film transistor T7 into the second node P(N), making both the eighth thin-film transistor T8 and the ninth thin-film transistor T9 conducted on, and the voltage level of the first node Q(N) and the output terminal G(N), namely the drain electrode (Drain) of the first thin-film transistor T1, both being the constant low voltage VGL. Afterwards, the Mth clock signal CK(M) undergoes alternate changes between high and low voltages so that the second thin-film transistor T2' is repeatedly conducted on and cut off. Since the first node Q(N) is of a low voltage, the source electrode (Source) of the first thin-film transistor T1 is kept at the low voltage, until the next time when the first node Q(N) and the Mth clock signal CK(M) are both high voltages where the source electrode (Source) of the first thin-film transistor T1 would become a high voltage again. In the phase, the source electrode (Source) and the drain electrode (Drain) of the first thin-film transistor T1 are both of a low voltage, making no voltage difference therebetween, and thus, the first thin-film transistor T1 bears no electric current stress. Thus, in the second embodiment of the GOA circuit of the present invention, at any time other than when the output terminal G(N) outputs a high voltage, no voltage difference is induced between the source and drain electrodes of the first thin-film transistor T1 and thus, the electric current stress that it bears is reduced to prevent the characteristics of the first thin-film transistor T1 from being affected by the electric current stress and thus influencing the performance of the GOA circuit, so as to effectively improve product quality.

In summary, the present invention provides a GOA circuit, which comprises an output module in which a second thin-film transistor is arranged, wherein the second thin-film transistor has a drain electrode electrically connected to a source electrode of the first thin-film transistor, a gate electrode receiving an input of a first control signal, and a source electrode receiving an input of an Mth clock signal so that the first control signal can be used to control the second thin-film transistor to turn on and off, or alternatively, the drain electrode of the second thin-film transistor is electrically connected to the source electrode of the first thin-film transistor, the gate electrode thereof receiving an input of the Mth clock signal and the source electrode thereof electrically connected to the first node to allow the second thin-film transistor to be conducted on only when the Mth clock signal is a high voltage and the first node is of a high voltage and is cut off at the remaining time, whereby it is possible to prevent a voltage difference from being induced between the source and drain electrodes of the first thin-film transistor to reduce the electric current stress that it bears and thus effectively improve product quality.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A gate-driver-on-array (GOA) circuit, comprising multiple stages of GOA unit connected in cascade, each of the stages of GOA unit comprising: a scanning control module, an output module, a pull-down module, and a first capacitor;

wherein with N and M being positive integers, in an Nth stage of GOA unit, which excludes first, second, second-to-last, and last stages of GOA unit:

the scanning control module receives inputs of a forward scanning signal and a backward scanning signal and is electrically connected to the output terminal of the (N−2)th stage of GOA unit, the output terminal of the (N+2)th stage of GOA unit, and a first node to pull up a voltage level of the first node according to a voltage level the output terminal of the (N−2)th stage of GOA unit, a voltage level of the output terminal of the (N+2)th stage of GOA unit, and the forward scanning signal and the backward scanning signal; the output module comprises a first thin-film transistor and a second thin-film transistor; the first thin-film transistor has a gate electrode electrically connected to the first node, a source electrode electrically connected to a drain electrode of the second thin-film transistor, and a drain electrode electrically connected to the output terminal; the second thin-film transistor has a gate electrode receiving an input of a first control signal and a source electrode receiving an input of an Mth clock signal; the pull-down module receives inputs of an (M+1)th clock signal, an (M−1)th clock signal, the forward scanning signal, the backward scanning signal, a constant high voltage, and a constant low voltage, and is electrically connected to the first node and the output terminal to pull down the voltage level of the first node to the constant low voltage under the control of the (M+1)th clock signal, the (M−1)th clock signal, the forward scanning signal, and the backward scanning signal; the first capacitor has a terminal receiving an input of the constant low voltage and an opposite terminal electrically connected to the first node; the first control signal controls the second thin-film transistor to conduct on when the first node is of a high voltage and the Mth clock signal is a high voltage and to cut off in the remaining time.

2. The GOA circuit according to claim 1, wherein the scanning control module comprises a third thin-film transistor and a fourth thin-film transistor, wherein the third thin-film transistor has a gate electrode electrically connected to the output terminal of the (N−2)th stage of GOA unit, a source electrode receiving an input of the forward scanning signal, and a drain electrode electrically connected to the first node; and the fourth thin-film transistor has a gate electrode electrically connected to the output terminal of the (N+2)th stage of GOA unit, a source electrode receiving an input of the backward scanning signal, and a drain electrode electrically connected to a drain electrode of the third thin-film transistor; and the pull-down module comprises a fifth thin-film transistor, a sixth thin-film transistor, a seventh thin-film transistor, an eighth thin-film transistor, and a ninth thin-film transistor, wherein the fifth thin-film transistor has a gate electrode receiving an input of the forward scanning signal, a source electrode receiving an input of the (M+1)th clock signal, and a drain electrode electrically connected to a drain electrode of the sixth thin-film transistor; the sixth thin-film transistor has a gate electrode receiving an input of the backward scanning signal and a source electrode receiving an input of the (M−1)th clock signal; the seventh thin-film transistor has gate electrode electrically connected to the drain electrode of the fifth thin-film transistor, a source electrode receiving an input of the constant high voltage, and a drain electrode electrically connected to a second node; the eighth thin-film transistor has a gate electrode electrically connected to the second node, a source electrode electrically connected to the first node, and a drain electrode receiving an input of the constant low voltage; the ninth thin-film transistor has a gate electrode electrically connected to the second node, a source electrode electrically connected to the output terminal, and a drain electrode receiving an input of the constant low voltage.

3. The GOA circuit according to claim 2, wherein each of the stages of GOA unit further comprises a node control module and a second capacitor; the node control module comprises a tenth thin-film transistor, wherein the tenth thin-film transistor has a gate electrode electrically connected to the first node, a source electrode electrically connected to the second node, and a drain electrode receiving an input of the constant low voltage; the second capacitor has a terminal electrically connected to the second node and an opposite terminal receiving an input of the constant low voltage.

4. The GOA circuit according to claim 2, wherein each of the stages of GOA unit further comprises a voltage stabilization module and a reset module;

wherein the voltage stabilization module comprises an eleventh thin-film transistor, wherein the eleventh thin-film transistor has a gate electrode receiving an input of the constant high voltage and a source electrode and a drain electrode electrically connected to the drain electrode of the third thin-film transistor and the first node, respectively, so as to have the drain electrode of the third thin-film transistor electrically connected to the first node; and the reset module comprises a twelfth thin-film transistor, wherein the twelfth thin-film transistor has a gate electrode and a source electrode both receiving an input of a reset signal and a drain electrode electrically connected to the second node.

5. The GOA circuit according to claim 2, wherein in each of the first and second stages of GOA unit, the third thin-film transistor has a gate electrode receiving an input of the circuit start signal;

in each of the second-to-last and last stages of GOA unit, the fourth thin-film transistor has a gate electrode receiving an input of the circuit start signal; and the (M−1)th clock signal, the Mth clock signal, the (M+1)th clock signal have identical pulse periods and have duty cycles that are all ⅓, wherein a falling edge of a previous one of the clock signals and a rising edge of a next one of the clock signal occur at the same time.

6. A gate-driver-on-array (GOA) circuit, comprising multiple stages of GOA unit connected in cascade, each of the stages of GOA unit comprising: a scanning control module, an output module, a pull-down module, and a first capacitor;

wherein with N and M being positive integers, in an Nth stage of GOA unit, which excludes first, second, second-to-last, and last stages of GOA unit:

the scanning control module receives inputs of the forward scanning signal and the backward scanning signal and is electrically connected to the output terminal of the (N−2)th stage of GOA unit, the output terminal of the (N+2)th stage of GOA unit and the first node to pull up a voltage level of the first node according to a voltage level the output terminal of the (N−2)th stage of GOA unit, a voltage level of the output terminal of the (N+2)th stage of GOA unit, and the forward scanning signal and the backward scanning signal; the output module comprises a first thin-film transistor and a second thin-film transistor; the first thin-film transistor has a gate electrode electrically connected to the first node, a source electrode electrically connected to a drain electrode of the second thin-film transistor, and a drain electrode electrically connected to the output terminal; the second thin-film transistor has a gate electrode receiving an input of an input of an Mth clock signal and a source electrode electrically connected to the first node; the pull-down module receives inputs of an (M+1)th clock signal, an (M−1)th clock signal, the forward scanning signal, the backward scanning signal, a constant high voltage, and a constant low voltage, and is electrically connected to the first node and the output terminal to pull down the voltage level of the first node to the constant low voltage under the control of the (M+1)th clock signal, the (M−1)th clock signal, the forward scanning signal, and the backward scanning signal; the first capacitor has a terminal receiving an input of the constant low voltage and an opposite terminal electrically connected to the first node; the first control signal controls the second thin-film transistor to conduct on when the first node is of a high voltage and the Mth clock signal is a high voltage and to cut off in the remaining time.

7. The GOA circuit according to claim 6, wherein the scanning control module comprises a third thin-film transistor and a fourth thin-film transistor, wherein the third thin-film transistor has a gate electrode electrically connected to the output terminal of the (N−2)th stage of GOA unit, a source electrode receiving an input of the forward scanning signal, and a drain electrode electrically connected to the first node; and the fourth thin-film transistor has a gate electrode electrically connected to the output terminal of the (N+2)th stage of GOA unit, a source electrode receiving an input of the backward scanning signal, and a drain electrode electrically connected to a drain electrode of the third thin-film transistor; and the pull-down module comprises a fifth thin-film transistor, a sixth thin-film transistor, a seventh thin-film transistor, an eighth thin-film transistor, and a ninth thin-film transistor, wherein the fifth thin-film transistor has a gate electrode receiving an input of the forward scanning signal, a source electrode receiving an input of the (M+1)th clock signal, and a drain electrode electrically connected to a drain electrode of the sixth thin-film transistor; the sixth thin-film transistor has a gate electrode receiving an input of the backward scanning signal and a source electrode receiving an input of the (M−1)th clock signal; the seventh thin-film transistor has gate electrode electrically connected to the drain electrode of the fifth thin-film transistor, a source electrode receiving an input of the constant high voltage, and a drain electrode electrically connected to a second node; the eighth thin-film transistor has a gate electrode electrically connected to the second node, a source electrode electrically connected to the first node, and a drain electrode receiving an input of the constant low voltage; the ninth thin-film transistor has a gate electrode electrically connected to the second node, a source electrode electrically connected to the output terminal, and a drain electrode receiving an input of the constant low voltage.

8. The GOA circuit according to claim 7, wherein each of the stages of GOA unit further comprises a node control module and a second capacitor; the node control module comprises a tenth thin-film transistor, wherein the tenth thin-film transistor has a gate electrode electrically connected to the first node, a source electrode electrically connected to the second node, and a drain electrode receiving an input of the constant low voltage; the second capacitor has a terminal electrically connected to the second node and an opposite terminal receiving an input of the constant low voltage.

9. The GOA circuit according to claim 7, wherein each of the stages of GOA unit further comprises a voltage stabilization module and a reset module;

wherein the voltage stabilization module comprises an eleventh thin-film transistor, wherein the eleventh thin-film transistor has a gate electrode receiving an input of the constant high voltage and a source electrode and a drain electrode electrically connected to the drain electrode of the third thin-film transistor and the first node, respectively, so as to have the drain electrode of the third thin-film transistor electrically connected to the first node; and the reset module comprises a twelfth thin-film transistor, wherein the twelfth thin-film transistor has a gate electrode and a source electrode both receiving an input of a reset signal and a drain electrode electrically connected to the second node.

10. The GOA circuit according to claim 7, wherein in each of the first and second stages of GOA unit, the third thin-film transistor has a gate electrode receiving an input of the circuit start signal;

in each of the second-to-last and last stages of GOA unit, the fourth thin-film transistor has a gate electrode receiving an input of the circuit start signal; and the (M−1)th clock signal, the Mth clock signal, the (M+1)th clock signal have identical pulse periods and have duty cycles that are all ⅓, wherein a falling edge of a previous one of the clock signals and a rising edge of a next one of the clock signal occur at the same time.

11. A gate-driver-on-array (GOA) circuit, comprising multiple stages of GOA unit connected in cascade, each of the stages of GOA unit comprising: a scanning control module, an output module, a pull-down module, and a first capacitor;

wherein with N and M being positive integers, in an Nth stage of GOA unit, which excludes first, second, second-to-last, and last stages of GOA unit:

the scanning control module receives inputs of a forward scanning signal and a backward scanning signal and is electrically connected to the output terminal of the (N−2)th stage of GOA unit, the output terminal of the (N+2)th stage of GOA unit, and a first node to pull up a voltage level of the first node according to a voltage level the output terminal of the (N−2)th stage of GOA unit, a voltage level of the output terminal of the (N+2)th stage of GOA unit, and the forward scanning signal and the backward scanning signal; the output module comprises a first thin-film transistor and a second thin-film transistor; the first thin-film transistor has a gate electrode electrically connected to the first node, a source electrode electrically connected to a drain electrode of the second thin-film transistor, and a drain electrode electrically connected to the output terminal; the second thin-film transistor has a gate electrode receiving an input of a first control signal and a source electrode receiving an input of an Mth clock signal; the pull-down module receives inputs of an (M+1)th clock signal, an (M−1)th clock signal, the forward scanning signal, the backward scanning signal, a constant high voltage, and a constant low voltage, and is electrically connected to the first node and the output terminal to pull down the voltage level of the first node to the constant low voltage under the control of the (M+1)th clock signal, the (M−1)th clock signal, the forward scanning signal, and the backward scanning signal; the first capacitor has a terminal receiving an input of the constant low voltage and an opposite terminal electrically connected to the first node; the first control signal controls the second thin-film transistor to conduct on when the first node is of a high voltage and the Mth clock signal is a high voltage and to cut off in the remaining time;

wherein the scanning control module comprises a third thin-film transistor and a fourth thin-film transistor, wherein the third thin-film transistor has a gate electrode electrically connected to the output terminal of the (N−2)th stage of GOA unit, a source electrode receiving an input of the forward scanning signal, and a drain electrode electrically connected to the first node; and the fourth thin-film transistor has a gate electrode electrically connected to the output terminal of the (N+2)th stage of GOA unit, a source electrode receiving an input of the backward scanning signal, and a drain electrode electrically connected to a drain electrode of the third thin-film transistor; and the pull-down module comprises a fifth thin-film transistor, a sixth thin-film transistor, a seventh thin-film transistor, an eighth thin-film transistor, and a ninth thin-film transistor, wherein the fifth thin-film transistor has a gate electrode receiving an input of the forward scanning signal, a source electrode receiving an input of the (M+1)th clock signal, and a drain electrode electrically connected to a drain electrode of the sixth thin-film transistor; the sixth thin-film transistor has a gate electrode receiving an input of the backward scanning signal and a source electrode receiving an input of the (M−1)th clock signal; the seventh thin-film transistor has gate electrode electrically connected to the drain electrode of the fifth thin-film transistor, a source electrode receiving an input of the constant high voltage, and a drain electrode electrically connected to a second node; the eighth thin-film transistor has a gate electrode electrically connected to the second node, a source electrode electrically connected to the first node, and a drain electrode receiving an input of the constant low voltage; the ninth thin-film transistor has a gate electrode electrically connected to the second node, a source electrode electrically connected to the output terminal, and a drain electrode receiving an input of the constant low voltage;

wherein each of the stages of GOA unit further comprises a node control module and a second capacitor; the node control module comprises a tenth thin-film transistor, wherein the tenth thin-film transistor has a gate electrode electrically connected to the first node, a source electrode electrically connected to the second node, and a drain electrode receiving an input of the constant low voltage; the second capacitor has a terminal electrically connected to the second node and an opposite terminal receiving an input of the constant low voltage;

wherein each of the stages of GOA unit further comprises a voltage stabilization module and a reset module;

wherein the voltage stabilization module comprises an eleventh thin-film transistor, wherein the eleventh thin-film transistor has a gate electrode receiving an input of the constant high voltage and a source electrode and a drain electrode electrically connected to the drain electrode of the third thin-film transistor and the first node, respectively, so as to have the drain electrode of the third thin-film transistor electrically connected to the first node; and the reset module comprises a twelfth thin-film transistor, wherein the twelfth thin-film transistor has a gate electrode and a source electrode both receiving an input of a reset signal and a drain electrode electrically connected to the second node; and wherein in each of the first and second stages of GOA unit, the third thin-film transistor has a gate electrode receiving an input of the circuit start signal;

in each of the second-to-last and last stages of GOA unit, the fourth thin-film transistor has a gate electrode receiving an input of the circuit start signal; and the (M−1)th clock signal, the Mth clock signal, the (M+1)th clock signal have identical pulse periods and have duty cycles that are all ⅓, wherein a falling edge of a previous one of the clock signals and a rising edge of a next one of the clock signal occur at the same time.

* * * * *